United States Patent
Morimoto et al.

(10) Patent No.: US 8,574,446 B2
(45) Date of Patent: Nov. 5, 2013

(54) APPARATUS AND METHOD FOR PLASMA PROCESSING

(75) Inventors: Tamotsu Morimoto, Yamanashi (JP); Takahiro Murakami, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 44 days.

(21) Appl. No.: 12/536,137

(22) Filed: Aug. 5, 2009

(65) Prior Publication Data
US 2009/0291564 A1    Nov. 26, 2009

Related U.S. Application Data

(62) Division of application No. 10/796,116, filed on Mar. 10, 2004, now abandoned.

(30) Foreign Application Priority Data

Mar. 10, 2003 (JP) .................. 2003-063011

(51) Int. Cl.
  *H01L 21/00*   (2006.01)
  *C23F 1/00*    (2006.01)
  *B44C 1/22*    (2006.01)

(52) U.S. Cl.
  USPC ........................ 216/67; 156/345.47

(58) Field of Classification Search
  USPC ........... 216/67; 438/710; 156/345.43, 345.44, 156/345.45, 345.46, 345.47
  See application file for complete search history.

(56) References Cited

U.S. PATENT DOCUMENTS

| | | | |
|---|---|---|---|
| 4,908,095 A | 3/1990 | Kagatsume et al. | |
| 5,110,437 A | 5/1992 | Yamada et al. | |
| 5,716,534 A | 2/1998 | Tsuchiya et al. | |
| 5,772,833 A | 6/1998 | Inazawa et al. | |
| 5,919,332 A | 7/1999 | Koshiishi et al. | |
| 6,000,360 A | 12/1999 | Koshimizu | |
| 6,155,200 A | 12/2000 | Horiike et al. | |
| 6,373,681 B2 * | 4/2002 | Kanno et al. | 361/234 |
| 6,379,576 B2 * | 4/2002 | Luo et al. | 216/67 |

FOREIGN PATENT DOCUMENTS

| | | |
|---|---|---|
| JP | 61-265820 | 11/1986 |
| JP | 3-113786 | 5/1991 |
| JP | 07-201496 | 8/1995 |
| JP | 10302998 A | 11/1998 |
| JP | 2002343787 A | 11/2002 |
| JP | 2002359203 A | 12/2002 |

\* cited by examiner

*Primary Examiner* — Sylvia R MacArthur
*Assistant Examiner* — Anna Crowell
(74) *Attorney, Agent, or Firm* — Oblon, Spivak, McClelland, Maier & Neustadt, L.L.P.

(57) ABSTRACT

At the time of plasma igniting or during plasma processing, only optimizing the distance between electrodes in each case caused a limitation to the prevention of charging damage. To resolve this, a novel plasma processing method employs a plasma processing apparatus which includes an upper electrode to which first high-frequency power is applied, a lower electrode to which second high-frequency power is applied, and a lift mechanism for controlling the spacing between the upper and lower electrodes. The first high-frequency power is applied to the upper electrode to cause plasma igniting. The method is adapted to make the spacing between the upper and lower electrodes larger at least at the time of plasma extinction than during plasma processing of a wafer on the lower electrode.

9 Claims, 4 Drawing Sheets

APPARATUS AND METHOD FOR PLASMA PROCESSING

This application is a divisional of application Ser. No. 10/796,116, filed on Mar. 10, 2004, which claims priority to Japanese application no. 2003/063011, filed on Mar. 10, 2003. The entire contents of application Ser. No. 10/796,116 are hereby incorporated herein by reference in their entirety.

BACKGROUND OF THE INVENTION

1. Field of the Invention

The present invention relates to an apparatus and a method for plasma processing and more particularly to an apparatus and a method for plasma processing which can reduce charging damage to objects to be processed being plasma processed using the plasma processing apparatus such as a parallel plate plasma processing apparatus.

2. Description of the Related Art

For example, conventionally known techniques of this type are disclosed in Japanese Patent Laid-Open Publication No. Hei 7-201496 (Claims 3 and 9, and Paragraphs [0010], [0031], and [0037]), Japanese Patent Laid-Open Publication No. Sho 61-265820 (Claim 1, Lines 6 to 13 on the top right column on page 2, Line 5 on the top left column on page 3 to line 2 on the bottom left column on the same page, and the column stating the Effects of the Invention), and Japanese Patent No. 3113786 (Claims 1 and 2, and Paragraphs [0029] and [0030]) (hereinafter, referred to as references 1 to 3, respectively).

The reference 1 suggests an apparatus and a method for generating plasma. This apparatus includes a voltage application electrode for being applied high-frequency power, a ground electrode, and a distance adjusting mechanism for variably adjusting the distance between these electrodes. When a voltage is applied to the voltage application electrode, the distance between the voltage application electrode and the ground electrode is reduced to such an extent as to readily provide an igniting in accordance with the Paschen's law. After plasma has been produced, the distance between these electrodes is then increased, thereby ensuring a high etching capability and low damage to the processed body at the same time.

On the other hand, since the distance control mechanism for adjusting the distance between the upper and lower electrodes makes the apparatus complicated, the reference 2 suggests a plasma processing apparatus that requires no distance control mechanism. This plasma processing apparatus has two electrodes, which are isolated from each other and each connected with an individual high-frequency power supply, and the distances between these electrodes and a ground electrode disposed to face these electrodes are different. With this apparatus, the high-frequency power applied to an electrode spaced apart farther from the ground electrode is stopped immediately after a discharge is initiated, thereby allowing for readily initiating a discharge at a low voltage even for high-rate etching. In other words, different electrodes are used for plasma igniting and plasma processing.

On the other hand, the reference 3 suggests a plasma processing apparatus with a two-frequency application scheme to apply respective high-frequency powers to the upper and lower electrodes. With this apparatus, the ON or OFF timing of the high-frequency powers applied to both the upper and lower electrodes is controlled to alleviate charging damage.

However, in the conventional plasma processing methods as suggested in the references 1 and 2, the distance between the upper and lower electrodes was optimized each at the time of plasma igniting and during plasma processing to alleviate charging damage and optimize the plasma processing at the same time. However, significant progress was made since then toward finer-line and thinner-film processes for semiconductor devices followed by significant improvements in plasma processing apparatuses. This resulted in only the distance between the electrodes being optimized each at the time of plasma igniting and during plasma processing, yet causing a limitation to the prevention of charging damage.

The present invention was developed to solve the aforementioned problem. It is therefore an object of the invention to provide an apparatus and a method for plasma processing which can prevent charging damage to objects to be processed even when progress will be made toward finer-line and thinner-film processes for semiconductor devices.

SUMMARY OF THE INVENTION

A plasma processing method according to a first aspect of the present invention is characterized in that when plasma processing an object to be processed using a plasma processing apparatus for allowing plasma generating means to cause plasma igniting, an amount of charges deposited on the object to be processed at least at the time of plasma extinction is reduced.

A plasma processing method according to a second aspect of the present invention employs a plasma processing apparatus which has an upper electrode and a lower electrode, a spacing therebetween being adjustable, and which causes plasma igniting by applying high-frequency power to at least one of the upper and lower electrodes. The method is characterized in that when plasma processing an object to be processed placed on the lower electrode using the plasma processing apparatus, the spacing is made larger at least at the time of plasma extinction than during plasma processing.

The plasma processing method according to a third aspect of the present invention, based on the second aspect of the invention, is characterized in that first high-frequency power is applied to the upper electrode, while second high-frequency power having a lower frequency than the first high-frequency power is applied to the lower electrode.

The plasma processing method according to a fourth aspect of the present invention, based on the second or third aspect of the invention, is characterized in that to increase the spacing, the lower electrode is moved away from the upper electrode.

The plasma processing method according to a fifth aspect of the present invention, based on the third or fourth aspect of the invention, is characterized in that the first high-frequency power is turned off after the second high-frequency power is turned off.

The plasma processing method according to a sixth aspect of the present invention, based on any one of the first to fifth aspects of the invention, is characterized by performing etching as the plasma processing.

A plasma processing apparatus according to a seventh aspect of the present invention includes a lower electrode for placing an object to be processed thereon, an upper electrode disposed above the lower electrode so as to oppose it, an adjusting mechanism for adjusting a spacing between the upper and lower electrodes by raising or lowering the lower electrode, and a high-frequency power supply for applying high-frequency power to at least one of the upper and lower electrodes, in which the high-frequency power is applied to either one of the electrodes to cause plasma igniting. The plasma processing apparatus is characterized in that the adjusting mechanism has a drive mechanism for making the spacing larger at least at the time of plasma extinction than during plasma processing of an object to be processed placed on the lower electrode.

The plasma processing apparatus according to an eighth aspect of the present invention, based on the seventh aspect of the invention, is characterized by including a first high-frequency power supply for applying first high-frequency power to the upper electrode, and a second high-frequency power supply for applying second high-frequency power having a lower frequency than the first high-frequency power to the lower electrode.

The plasma processing apparatus according to a ninth aspect of the present invention, based on the seventh or eighth aspect of the invention, is characterized in that the adjusting mechanism has a drive mechanism for moving the lower electrode away from the upper electrode.

The plasma processing apparatus according to a tenth aspect of the present invention, based on the eighth or ninth aspect of the invention, is characterized in that the first high-frequency power is turned off after the second high-frequency power is turned off.

The plasma processing apparatus according to an eleventh aspect of the present invention, based on any one of the seventh to tenth aspects of the invention, is characterized by performing etching as the plasma processing.

DETAILED DESCRIPTION OF THE PREFERRED EMBODIMENTS

Figure 5:
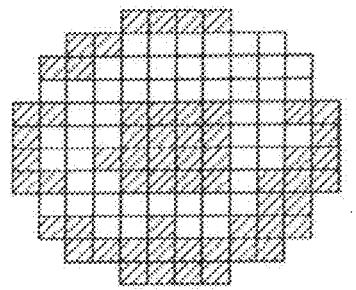
FIG. 5 is a schematic plan view illustrating a defective wafer that has been processed by a conventional plasma processing method in which the upper and lower electrodes are set at an optimum spacing.

The inventors decided to thoroughly address the present charging damage. To this end, for example, a parallel plate plasma processing apparatus with the two-frequency application scheme was used for applying high-frequency powers to the upper and lower electrodes at different frequencies, respectively. With this apparatus, the distance between the upper and lower electrodes was optimized. Under this condition, plasma igniting, plasma processing (etching), and plasma extinction are performed on a wafer to determine the distribution of breakdown voltages of an antenna MOS (with an antenna ratio of one million). Consequently, as shown by the shaded lines illustrated in FIG. 5, defective devices due to a breakdown in the gate insulating film were found at the central portion and periphery of the wafer, resulting in up to a yield of 45%.

Figures 6A, 6B:
FIGS. 6A and 6B are schematic sectional views illustrating the CHARM®-2 wafer sensor, FIG. 6A showing a potential sensor, FIG. 6B showing a current sensor.

In this regard, the inventors employed CHARM®-2 wafer (Wafer Charging Monitors, Inc.) for monitoring charging of wafer to determine the percentage of defective devices resulting from charging damage to each device. As shown in FIGS. 6A and 6B, the CHARM®-2 wafer includes a potential sensor (see FIG. 6A), a current sensor (see FIG. 6B), and a UV sensor. Each sensor has a CCE (Charging Collection Electrode) on its surface and an EEPROM serving as the storage portion of each sensor that is initially set to a predetermined potential. As a result, the potential sensor showed that the periphery of the wafer was positively charged while the central portion was negatively charged. Additionally, the current sensor showed that a positive current flew through the periphery of the wafer, while a negative current flew through the central portion, thereby causing the breakdown of the gate insulating film to occur in the periphery and the central portion of the wafer.

Further examined was the relation between the spacing between the upper and lower electrodes and the charging using the CHARM®-2 wafer. This examination showed that charging damage was reduced with increasing spacing between the upper and lower electrodes. However, there is a tradeoff between the spacing between the upper and lower electrodes being increased and the process performance (e.g., uniformity, etching rate, and etched features). Thus, only an increase in the spacing between the electrodes provides no compatibility between the charging damage and the process performance.

Figure 7:
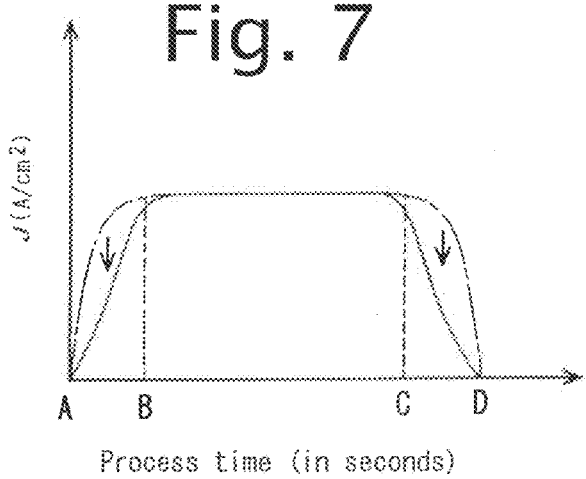
FIG. 7 is a graph showing the relation between the wafer process time and the amount of charges supplied onto each device of a wafer.

In this regard, with the distance between the upper and lower electrodes being set to an optimum value, a wafer having MOS devices was plasma processed to determine the relation between the duration of wafer processing and the amount of charges (electric current) supplied from the plasma to the MOS device. As a result, the relation was found to be expressed by the model indicated by the alternate long and short dashed lines shown in FIG. 7. In this figure, the current from point A to D can be integrated with respect to time to obtain the amount of charging of the device. In FIG. 7, point A indicates the time of application of high-frequency power, point B indicating the time of igniting, point C indicating the time of plasma extinction resulting from the high-frequency power being ceased, point D indicating the time of the plasma processing being terminated, and the interval between points B and C indicating the duration of plasma processing.

As can be seen from FIG. 7, there is a fairly large amount of charging not only during the period from the time of high-frequency application (point A) to time of the plasma igniting (point B) but also during the period from the time of plasma extinction (point C) to the time of plasma processing being terminated (point D). It was thus found that such charging greatly contributed to charging damage. Based on this fact, the currents present during the period from the time of high-frequency application (point A) to the time of plasma igniting (point B) and during the period from the time of plasma extinction (point C) to the time of plasma processing being terminated (point D) were attempted to be reduced from the alternate long and short dashed lines to the real lines as shown by the arrows in the figure in order to reduce the total amount of charging. By this, it was found that an imbalance between the amounts of positive and negative charges within the wafer surface was reduced, thus preventing or significantly alleviating charging damage such as breakdown in the gate insulating film.

Now, the present invention will be described below in more detail with reference to FIGS. 1 to 4 in accordance with the embodiments.

Figure 1:
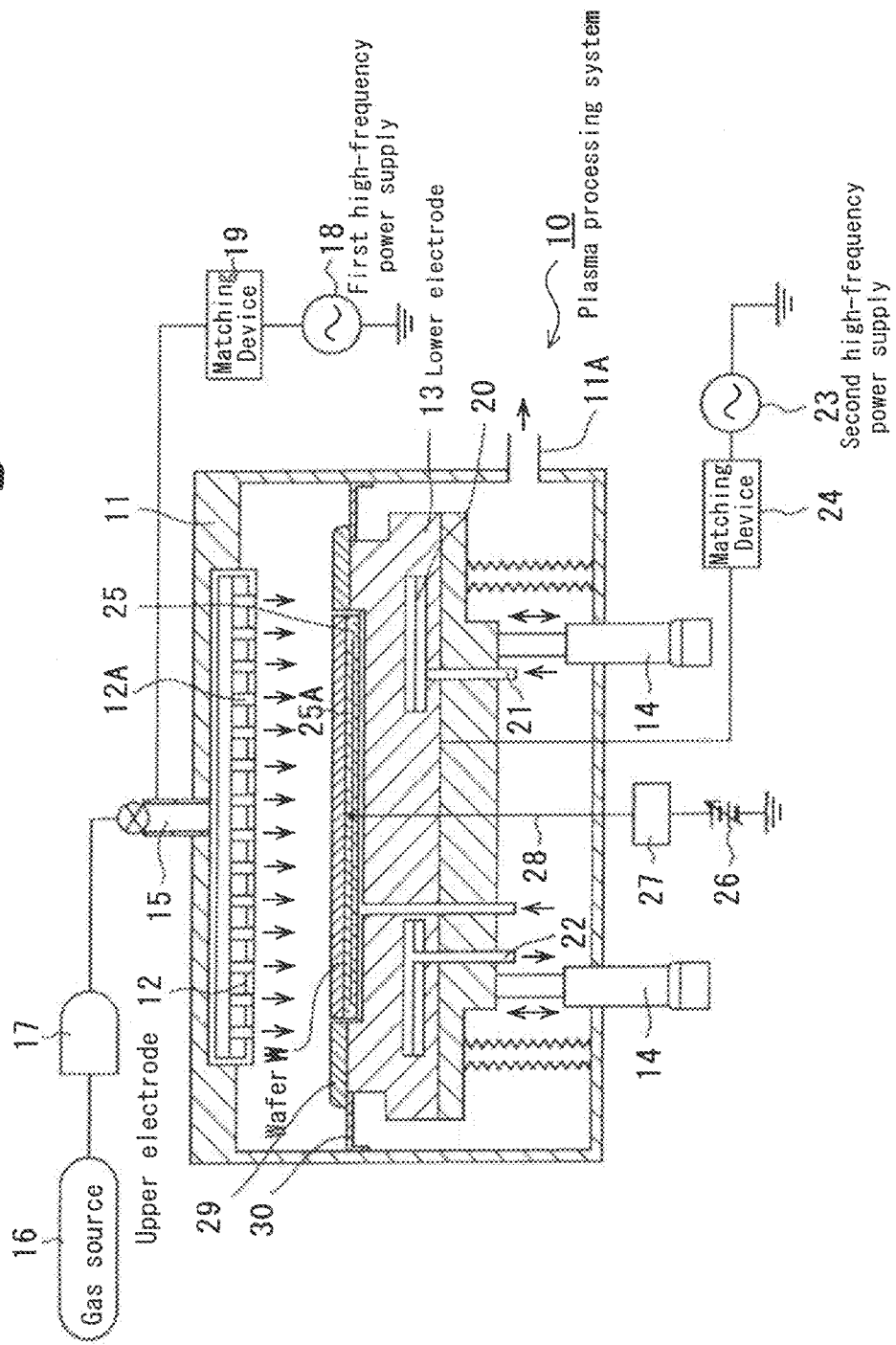
FIG. 1 is a sectional view illustrating the structure of a plasma processing apparatus according to an embodiment, which is employed for a plasma processing method of the present invention.

First, an example of a plasma processing apparatus used for a method of the present invention will be explained with reference to FIG. 1. As shown in FIG. 1, by way of example, a plasma processing apparatus 10 employed in this embodiment includes a chamber 11 made of a conductive material such as aluminum, an upper electrode 12 disposed on the upper surface in the chamber 11, a lower electrode 13 for placing a wafer W thereon, the lower electrode 13 being disposed below the upper electrode 12 so as to oppose it, and a lift mechanism (e.g., an air cylinder) 14 for adjusting the spacing between the lower electrode 13 and the upper electrode 12 by raising or lowering the lower electrode 13.

The upper electrode 12, having a plurality of holes 12A formed on the entire lower surface thereof, serves as a showerhead for supplying process gases. The center hole on the upper surface of the upper electrode 12 is connected with a gas supply pipe 15, which is in turn connected with a gas source 16 via a mass flow controller 17, to supply a process gas from the gas source 16 into the chamber 11 while the flow of the process gas is being controlled by the mass flow controller 17. The upper electrode 12 is also connected with a first high-frequency power supply 18 via a matching device 19, allowing the first high-frequency power supply 18 to apply first high-frequency power to the upper electrode 12, e.g., at 13.56 to 150 MHz.

Inside the lower electrode 13, there is provided temperature control means 20, such as a cooling jacket, which sets the wafer W held on the lower electrode 13 to the desired processing temperature. The temperature control means 20 has a supply pipe 21 and an exhaust pipe 22 for circulating a coolant through the cooling jacket. This configuration allows the coolant controlled at a predetermined temperature to be supplied through the supply pipe 21 into the cooling jacket as well as a heat-exchanged coolant to be exhausted outwardly through the exhaust pipe 22. Additionally, the lower electrode 13 is connected with a second high-frequency power supply 23 via another matching device 24, allowing the second high-frequency power supply 23 to apply second high-frequency power (bias) to the lower electrode 13, e.g., at 400 kHz to 13.56 MHz. Furthermore, the lower electrode 13 may also be provided therein with a heater or a Peltier device instead of the cooling jacket.

There is placed an electrostatic chuck 25 on the upper surface of the lower electrode 13. The electrostatic chuck 25 has a tungsten electrode plate 25A interposed in between ceramic layers formed by sintering or spray forming. The tungsten electrode plate 25A is connected with a variable DC voltage source 26 via a filter 27 and a lead wire 28. The variable DC voltage source 26 applies a high DC voltage to the tungsten electrode plate 25A, thereby causing the wafer W placed on the lower electrode 13 to be electrostatically attracted to the ceramic layers.

On the outer circumferential edge of the lower electrode 13, there is provided an annular focus ring 29, which is adapted to surround the wafer W held electrostatically on the electrostatic chuck 25. The focus ring 29, selectively made of an insulating or conductive material depending on the process, serves to confine or spread reactive ions. Also disposed between the chamber 11 and the lower electrode 13 is an exhaust ring 30 having a plurality of ventilating holes bored therein. The exhaust ring 30 is disposed at a level lower than the upper surface of the lower electrode 13 to surround the lower electrode 13. This exhaust ring 30 puts the exhaust flow into order and optimally confines the plasma in between the upper electrode 12 and the lower electrode 13.

Inside the lower electrode 13, there is also formed a flow path (not shown) for supplying therethrough a thermally conductive gas (e.g., He gas) as a backside gas. The gas flow path, having a plurality of openings at the central portion and the peripheral edge of the wafer W, supplies the backside gas to between the electrostatic chuck 25 and the wafer W to enhance the thermal conductivity between the lower electrode 13 and the wafer W, thereby making it possible to quickly control the wafer W at a predetermined temperature.

At a lower portion in the chamber 11, there is formed an exhaust portion 11A connected to a vacuum exhaust apparatus (not shown), which creates a vacuum in the chamber 11 and then allows the chamber 11 containing a process gas introduced therein to be maintained under a predetermined degree of vacuum. The gas source 16 has a plurality of gas sources, each of which supplies as an etchant gas, e.g., fluorocarbon-based gases such as $C_4F_8$, a carbon monoxide (CO) gas, an oxygen ($O_2$) gas, or rare gases such as an argon (Ar) gas. Each gas is flow controlled by the mass flow controller 17 to be supplied at the desired flow rate.

Now, a plasma processing method that employs the plasma processing apparatus 10 will be explained with reference to FIGS. 2 and 3 in accordance with an embodiment of the present invention. In this embodiment, a 300 mm wafer W is etched.

Figure 2A:
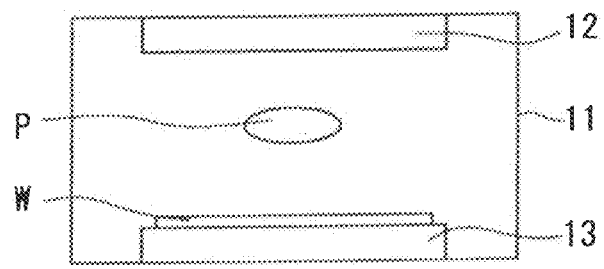
FIGS. 2A to 2C are explanatory views illustrating how the lower electrode works during a step of plasma processing in the plasma processing apparatus shown in FIG. 1, FIG. 2A being a sectional view illustrating the upper and lower electrodes being spaced apart farther at the time of plasma igniting than the optimum spacing provided during plasma processing, FIG. 2B being a sectional view illustrating the upper and lower electrodes being set to the optimal spacing provided during plasma processing, FIG. 2C being a sectional view illustrating the upper and lower electrodes being spaced apart farther at the time of plasma extinction than the optimum spacing provided during plasma processing.

For etching, the temperatures of the inner circumferential surface of the chamber 11, the upper electrode 12, and the lower electrode 13 are pre-set to 50° C., 30° C., and 10° C., respectively. Under this condition, as shown in FIG. 2A, the spacing between the upper electrode 12 and the lower electrode 13 in the chamber 11 is first set to a spacing (e.g., 22 mm) greater than the optimum spacing (e.g., 17 mm) employed for etching the wafer W. Then, a gate valve (not shown) is opened to place the wafer W on the lower electrode 13 in the chamber 11, and the gate valve is then closed. Subsequently, $C_4F_8$, CO, Ar, and $O_2$ gases are introduced as an etchant gas from the gas source 16 into the chamber 11 at a predetermined flow rate (e.g., $C_4F_8$:CO:Ar:$O_2$=20:40:550:12 (sccm)), so that the chamber 11 is set to a pressure of 40 mTorr.

Meanwhile, the variable DC voltage source 26 applies a high DC voltage to the tungsten electrode plate 25A in order to securely attract the wafer W to the lower electrode 13 in an electrostatic manner. A backside gas (e.g., He gas) is supplied as well. At this time, the backside gas is set to pressures of 12 Torr at the central portion of the wafer W as well as to 20 Torr at the circumferential edge of the wafer W. The temperature control means 20 in the lower electrode 13 maintains the wafer W at the predetermined temperature.

Figure 3:
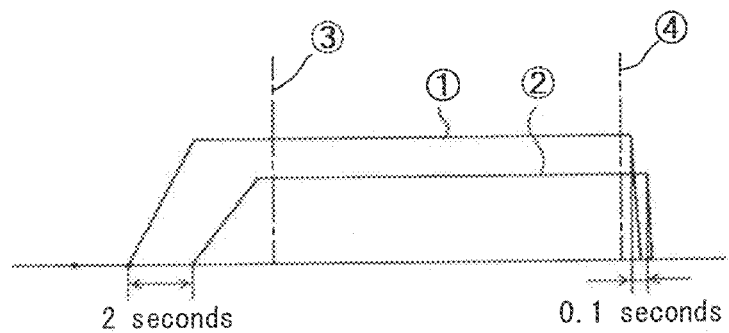
FIG. 3 is an explanatory view illustrating the timing of application and disconnection of first and second high-frequency powers.

Now, as shown by ① in FIG. 3, by way of example, 15 seconds after the application of the high DC voltage, the first high-frequency power supply 18 applies the first high-frequency power of 2000 W to the upper electrode 12 at 27 MHz to cause a glow discharge between the upper electrode 12 and the lower electrode 13 for plasma igniting. As shown by ② in FIG. 3, two seconds after the application of the first high-frequency power, the second high-frequency power supply 23 applies the second high-frequency power of 1400 W to the lower electrode 13 at 800 kHz, thereby generating a bias potential on the lower electrode 13. At this time, the timing of applying the second high-frequency power to the lower electrode 13 is delayed by about 0.2 to 3 seconds with respect to the timing of applying the first high-frequency power to the upper electrode 12, thereby allowing the matching device 24 to provide a smooth matching to the second high-frequency power. Similarly, for the application of the first and second high-frequency power to the lower electrode, the second high-frequency power is delayed, thereby allowing the matching device to provide a smooth matching.

Figure 2B:
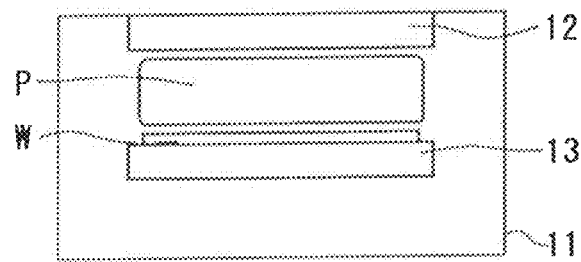

As shown by ③ in FIG. 3, at the point in time immediately thereafter, the lift mechanism 14 is actuated to raise the lower electrode 13. As shown in FIG. 2B, the lift mechanism 14 then stops when the spacing between the lower electrode 13 and the upper electrode 12 has reached the optimum spacing of 17 mm. Under this condition, the first and second high-frequency powers are stabilized at 2000 W and 1400 W, respectively, to etch the wafer W.

Figure 2C:
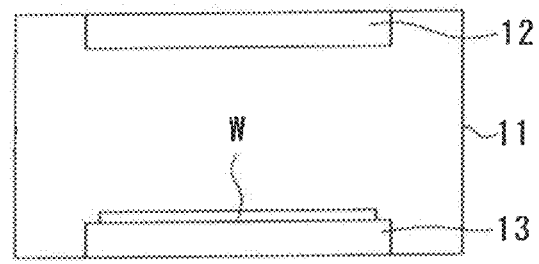

As shown by ④ in FIG. 3, at the point in time immediately before turning off the first high-frequency power supply 18 following the etching having been performed for a predetermined duration, the lift mechanism 14 is actuated to lower the lower electrode 13. Then, as shown in FIG. 2C, the spacing between the upper electrode 12 and the lower electrode 13 is increased to reach 22 mm to provide a larger spacing to between the upper and lower electrodes 12, 13, allowing the lift mechanism 14 to stop. Now, as shown by ① and ② in FIG. 3, the first high-frequency power supply 18 is turned off, and the second high-frequency power supply 23 is turned off 0.1 seconds thereafter to cause plasma extinction, thereby terminating the etching. Subsequently, 20 seconds after the etching has been terminated, the variable DC voltage source 26 is turned off to release the electrostatic attraction of the wafer W provided by the electrostatic chuck 25. The wafer W is then taken out of the chamber 11. No defective devices caused by charging damage were found in this wafer W resulting in a yield of 100%.

As a comparative example for comparison with this embodiment, a wafer W was etched in the same manner as the aforementioned embodiment except that the plasma extinction was provided while the spacing between the upper electrode 12 and the lower electrode 13 was held at the optimum value of 17 mm without lowering the lower electrode 13. As a result, the yield of the devices slightly decreased to 99%. On the other hand, a wafer W was etched in the same manner as the aforementioned embodiment except that the spacing between the upper electrode 12 and the lower electrode 13 was set at the optimum value of 17 mm with the lower electrode 13 being fixed throughout the etching. This resulted in a yield of only 77%.

Figure 4:
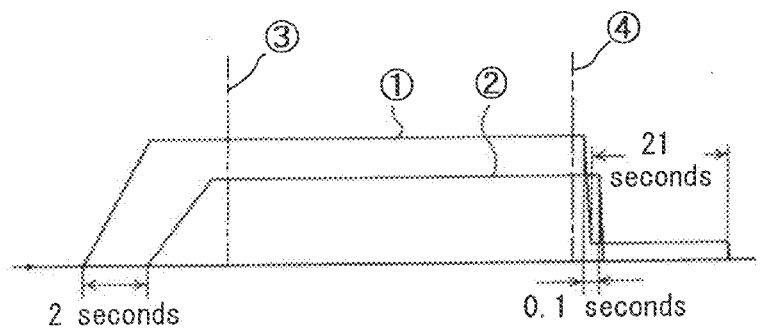
FIG. 4 is an explanatory view illustrating the timing of application and disconnection of the first and second high-frequency powers.

As shown in FIG. 4, plasma extinction is provided through a step-down sequence in which the first high-frequency power supply 18 is turned off in two stages to prevent particles from adhering to the wafer W when etched. Now, the present invention will be described in accordance with an embodiment incorporating the step-down sequence.

In this embodiment, the plasma igniting and the plasma processing are carried out in the same manner as in the aforementioned embodiment except that the plasma extinction is carried out through the step-down sequence. That is, by way of example, to provide plasma extinction through the use of the step-down sequence, the spacing between the upper electrode 12 and the lower electrode 13 is increased from the optimum spacing of 17 mm to 25 mm. Then, as shown in FIG. 4, the first high-frequency power is decreased from 2000 W to 200 W, and the second high-frequency power is turned off 0.1 seconds thereafter. When the first high-frequency power is decreased to 200 W, the flow of the Ar gas in the etchant gas is decreased from 550 sccm to 500 sccm, while the pressure of the chamber 11 is increased from 40 mTorr to 200 mTorr. Under this condition, the wafer W is processed for 21 seconds. Thereafter, the first high-frequency power is completely turned off to provide plasma extinction. The processes following the plasma extinction are the same as those of the aforementioned embodiment. The wafer W processed through the step-down sequence provides a yield of 100% to the devices without any defective devices caused by charging damage. In the foregoing, the timings ① to ④ shown in FIG. 4 correspond to the timings ① to ④ shown in FIG. 3, respectively.

To compare with this embodiment, the first high-frequency power was turned off through two stages (2000 W→200 W→0 W) in accordance with the step-down sequence to provide plasma extinction while the spacing between the upper electrode 12 and the lower electrode 13 was being held at the optimum value of 17 mm without increasing the spacing at the time of plasma extinction. In this case, defective devices due to charging damage were found, causing a decrease in their yield down to 44%. This showed that the use of the step-down sequence does not provide a sufficient prevention of charging damage only by increasing the spacing between the upper and lower electrodes 12, 13 at the time of plasma igniting.

As described above, according to this embodiment, when a wafer W is plasma processed using the plasma processing apparatus 10, the lower electrode 13 is lowered, during the plasma igniting (the time from point A to point B in FIG. 7) and the plasma extinction (the time from point C to point D in FIG. 7), thereby causing the spacing between the upper electrode 12 and the lower electrode 13 to become larger than the optimum distance therebetween provided during the plasma processing (the time from point B to point C in FIG. 7). This makes it possible to reduce the amount of charges deposited on the wafer W during the plasma igniting and the plasma extinction, thereby preventing charging damage to the wafer W.

Furthermore, according to this embodiment, the first high-frequency power is turned off after the second high-frequency power is turned off. This ensures particularly that the plasma extinction is carried out smoothly to reduce charges to be deposited on the wafer W and particles are prevented from adhering to the wafer W.

In the aforementioned embodiment, a plasma processing method has been described in which the plasma processing apparatus 10 employing the two-frequency application scheme is used to separately apply the first and second high-frequency powers to the upper and lower electrodes 12, 13 for etching; however, the present invention is not limited thereto. For example, the method of the present invention can also employs a plasma processing apparatus for applying high-frequency power to one of the upper and lower electrodes to generate plasma or a plasma processing apparatus of an ECR (with a magnetic field) type. Furthermore, the plasma processing method of the present invention can also employ a plasma processing apparatus including other plasma generating means. Still furthermore, the plasma processing method of the present invention can be applied to plasma processing other than etching, such as CVD. In essence, the present invention is intended to reduce the amount of charges deposited on an object to be processed at least during plasma extinction when a plasma processing apparatus employing plasma generating means to provide plasma igniting is used for plasma processing of the object to be processed.

Even when progress is made toward finer-line and thinner-film processes for semiconductor devices, according to the first to eleventh aspects of the invention, provided are a plasma processing apparatus and a method for plasma processing which can prevent charging damage to objects to be processed by reducing the amount of charges deposited thereon during plasma processing and preventing an imbalance between the amounts of positive and negative charges on the surface thereof.

What is claimed is:

1. A plasma processing method comprising:
providing a lower electrode for placing an object to be processed thereon;
providing an upper electrode disposed above the lower electrode and opposing the lower electrode;
providing an adjusting mechanism that adjusts a spacing between the upper and lower electrodes by raising or lowering the lower electrode, the adjusting mechanism including a drive mechanism;
providing a variable DC voltage source that applies DC voltage to the lower electrode;
providing a first high-frequency power supply that applies first high-frequency power to the upper electrode, the first high-frequency power being applied to the upper electrode to cause plasma ignition;
providing a second high-frequency power supply that applies second high-frequency power to the lower electrode;
applying the DC voltage to the lower electrode;
applying a first value of the first high-frequency power to the upper electrode;
applying a second value of the second high-frequency power to the lower electrode;
minimizing an amount of charge on devices on the object for an igniting duration by maintaining the spacing during the igniting period at a constant second spacing, which is larger than a constant first spacing, for an initial period of time immediately after the time of plasma ignition;
subsequently setting the spacing from the constant second spacing directly to the constant first spacing;
minimizing the amount of charge on devices on the object for an extinction duration by subsequently setting the spacing from the constant first spacing directly to the constant second spacing, before the time of plasma extinction;
subsequently decreasing the first high-frequency power from the first value of the first high-frequency power to a third value of the first high-frequency power, decreasing a flow of processing gas, increasing pressure of a chamber, turning off the second high-frequency power from the second value of the second high-frequency power, and turning off the first high-frequency power from the third value of the first high-frequency power; and
subsequently turning off the variable DC voltage source.

2. The plasma processing method according to claim 1, further comprising
moving the lower electrode away from the upper electrode via the drive mechanism in the adjusting mechanism.

3. The plasma processing method according to claim 1, wherein etching is performed as the plasma processing.

4. The plasma processing method according to claim 1, wherein the driving mechanism sets the spacing to the first spacing after the time of plasma ignition.

5. The plasma processing method according to claim 1, wherein the first spacing is a narrowest spacing provided by the apparatus between the time of the plasma ignition and the time of plasma extinction.

6. The plasma processing method according to claim 5, wherein the first spacing is 17 mm.

7. The plasma processing method according to claim 1, wherein the first high-frequency power is turned on before the second high-frequency power is turned on.

8. The plasma processing method according to claim 1, wherein the decreasing flow of processing gas decreases the flow from 550 sccm to 500 sccm while the pressure of the chamber increases from 40 m Torr to 200 m Torr.

9. The plasma processing method according to claim 1, wherein the second high frequency power is turned off 0.1 seconds after the first high frequency is decreased to the third value.

* * * * *